(12) United States Patent
Chen et al.

(10) Patent No.: US 9,293,584 B2
(45) Date of Patent: Mar. 22, 2016

(54) FINFET DEVICES

(75) Inventors: Xiangdong Chen, Irvine, CA (US); Henry Chen, Irvine, CA (US); Agnes Woo, Encino, CA (US); Wei Xia, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 267 days.

(21) Appl. No.: 13/287,331

(22) Filed: Nov. 2, 2011

(65) Prior Publication Data

US 2013/0105942 A1    May 2, 2013

(51) Int. Cl.
*H01L 29/78*    (2006.01)
*H01L 29/66*    (2006.01)
*H01L 29/94*    (2006.01)
*H01L 49/02*    (2006.01)

(52) U.S. Cl.
CPC ............. *H01L 29/785* (2013.01); *H01L 28/20* (2013.01); *H01L 29/66795* (2013.01); *H01L 29/7855* (2013.01); *H01L 29/7856* (2013.01); *H01L 29/94* (2013.01)

(58) Field of Classification Search
CPC ............ H01L 29/7856; H01L 29/7855; H01L 29/785
USPC ............................ 438/382, 381; 257/E21.004
See application file for complete search history.

(56) References Cited

U.S. PATENT DOCUMENTS

| | | | |
|---|---|---|---|
| 2002/0036290 A1 | 3/2002 | Inaba et al. | |
| 2002/0109182 A1 | 8/2002 | Lee et al. | |
| 2003/0102497 A1* | 6/2003 | Fried et al. | 257/255 |
| 2004/0075122 A1* | 4/2004 | Lin et al. | 257/288 |
| 2005/0035415 A1 | 2/2005 | Yeo et al. | |
| 2005/0056888 A1* | 3/2005 | Youn et al. | 257/331 |
| 2005/0077553 A1* | 4/2005 | Kim et al. | 257/288 |
| 2005/0136617 A1* | 6/2005 | Jang | 438/427 |
| 2006/0170031 A1 | 8/2006 | Kang et al. | |
| 2007/0018239 A1 | 1/2007 | Chen et al. | |
| 2007/0132000 A1 | 6/2007 | Hsu et al. | |
| 2008/0150030 A1 | 6/2008 | Yokoyama et al. | |
| 2009/0108316 A1 | 4/2009 | Xiong et al. | |
| 2010/0155843 A1 | 6/2010 | Mayer et al. | |
| 2010/0327363 A1 | 12/2010 | Nakabayashi | |

(Continued)

FOREIGN PATENT DOCUMENTS

EP    0 709 893 A2    5/1996
KR    10-2004-014731    12/2004

OTHER PUBLICATIONS

European Search Report in co-pending, related EP Application No. 12005816.9, mailed Jan. 31, 2013.

(Continued)

*Primary Examiner* — Amar Movva
(74) *Attorney, Agent, or Firm* — Oblon, McClelland, Maier & Neustadt, L.L.P.

(57) ABSTRACT

Disclosed are various embodiments of FinFET semiconductor devices. A pair of matched capacitors can be formed that share a common source, drain and/or channel. Accordingly, the capacitance characteristics of each capacitor can be manufactured such that they are similar to one another. A resistor manufactured by employing FinFET techniques is also described. The resistor can be manufactured with an effective length that is greater than a distance traversed along a substrate by the resistor.

20 Claims, 8 Drawing Sheets

(56) References Cited

U.S. PATENT DOCUMENTS

2011/0062518 A1* 3/2011 Chan et al. .................... 257/347
2011/0068404 A1 3/2011 Sugiura et al.

OTHER PUBLICATIONS

Chinese Office Action issued Nov. 26, 2014, in Chinese Application No. 201210371062.4 (8 pages).

* cited by examiner

FINFET DEVICES

BACKGROUND

Semiconductor devices are increasing in layout density. Fin-type manufacturing techniques are employed to create non-planar structures on a semiconductor substrate. In these techniques, a semiconductor "fin" is formed, which facilitates formation of the gate of a device. Device density can be increased because the channel, source, and/or drain can be raised out of the semiconductor substrate, which reduces potential current leakage from the device. Accordingly, a device manufactured according to such a technique is often referred to as a fin-shaped field effect transistor (FinFET).

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
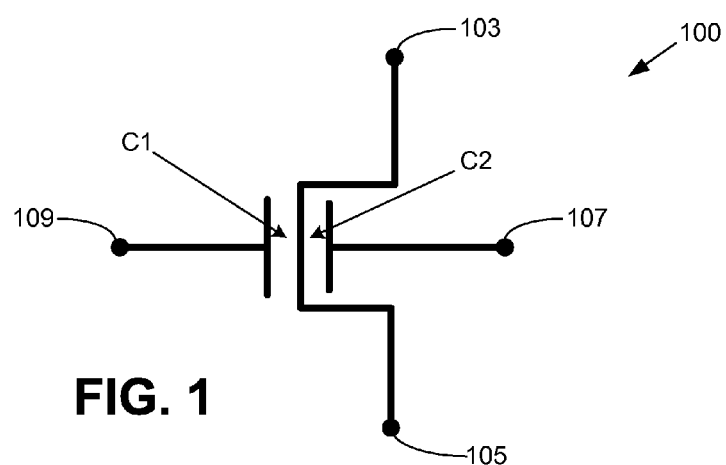
FIG. 1 is a drawing of a pair of matched capacitors according to an embodiment of the disclosure.
Figure 2:
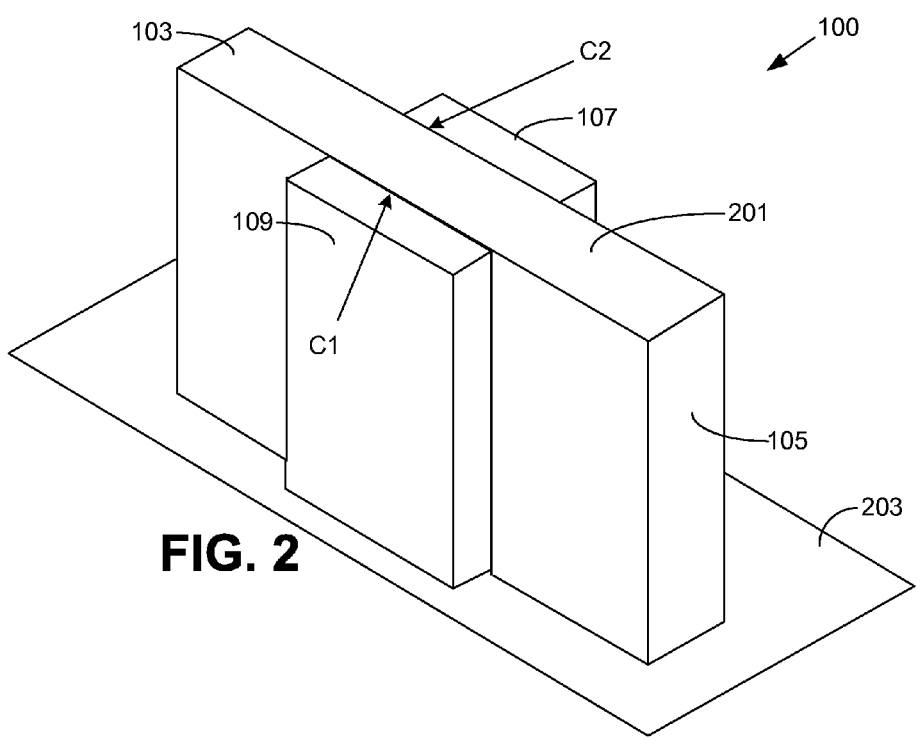
FIG. 2 is an alternative depiction of the pair of matched capacitors of FIG. 1 according to an embodiment of the disclosure.
Figure 3:
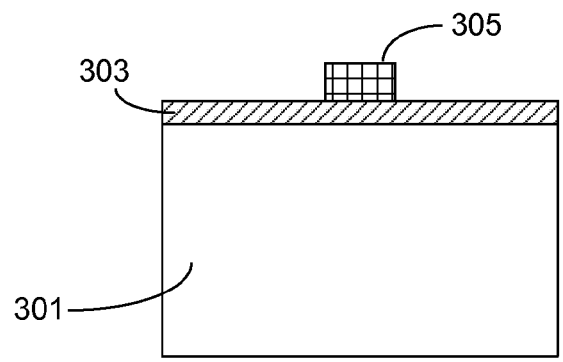
FIGS. 3-7 illustrate a method of manufacturing a pair of matched capacitors as illustrated in FIGS. 1-2 according to an embodiment of the disclosure.

Embodiments of the disclosure relate to the fabrication of matched capacitors and resistors by employing FinFET techniques. Metal-oxide-semiconductor capacitors (MOSCaps) are often employed in semiconductor devices. Additionally, matched MOSCaps having similar and/or identical capacitance are often needed for various devices as can be appreciated by a person of ordinary skill in the art. In particular, semiconductor devices employing analog signals often require capacitance matching of two or more capacitors fabricated on a semiconductor substrate. As should be appreciated, the capacitance value of a MOSCap can be determined by the area of the capacitor, the doping of the silicon, and/or thickness of the dielectric. Accordingly, with reference to FIGS. 1-2, shown is one embodiment of a pair of matched capacitors 100, or MOSCaps, with similar and/or nearly identical capacitor area as well as silicon doping. As will be shown in subsequent drawings, the insulator or dielectric thickness is also similar between each of the capacitors in a design according to an embodiment of the disclosure.

FIG. 1 illustrates the theory of operation of a pair of matched capacitors 100 labeled C1 and C2 according to an embodiment of the disclosure. The pair of capacitors C1 and C2 share a common drain 103 and source 105. A charge can be held across the each of the gates 107, 109 and a common channel, which can improve the matching characteristics of the capacitors relative to one another relative to prior art designs. FIG. 2 illustrates an alternative depiction of the matched capacitors 100 shown in FIG. 1. FIG. 2 illustrates how the capacitors can be formed in a three-dimensional structure employing FinFET techniques. Accordingly, a fin structure 201 can be formed on a semiconductor substrate 203. The semiconductor substrate as well as the fin structure 201 itself can comprise, for example, a semiconductor material, such as silicon, germanium, or any other semiconductor material. The gates 107, 109 of each capacitor C1 and C2 can also be formed with a conductive material atop a semiconductor substrate abutting the fin structure 201 such that a charge can be held across each of the gates 107, 109 and the fin structure, respectively.

Because each of the depicted capacitors C1 and C2 share a common semiconductor fin structure 201 as well as a source 105 and drain 103, the capacitance properties of each are matched closely relative to designs that do not incorporate such a characteristic. Additionally, because each of the gates 107, 109 can be formed out of a single deposition of conductive material, the chemical and physical properties of each gate 107, 109 are also similar. Likewise, a dielectric or insulator formed between each of the gates 107, 109 and the fin structure 201 can also be formed from a single deposition of material, leading to the same benefit. In other words, according to embodiments of the disclosure two matched MOSCaps are formed on the same transistor, and therefore, the channel doping and capacitor dimensions of each capacitor are identical or similar.

Reference is now made to FIGS. 3-7, which illustrate cross sectional views of one example of a device formed according to embodiments of the disclosure. The matched capacitors illustrated in FIGS. 3-7 are formed by employing FinFET based manufacturing technology. Accordingly, a semiconductor substrate 301 is formed. In some embodiments, the substrate 301 can comprise, for example, a wafer on which various other layers to form semiconductor devices are deposited in a semiconductor manufacturing process. The substrate 301 can comprise, for example, a single crystal silicon, Germanium, SiGe, Ga, As, and/or any other semiconductor compatible with FinFET manufacturing techniques as should be appreciated by a person of ordinary skill in the art.

To form the matched capacitor device according to various embodiments of the disclosure, a hard mask layer 303 can be deposited on the semiconductor substrate 301. The hard mask layer can comprise, for example, an oxide or nitride layer, and is deposited to facilitate formation of the fin structure. A photoresist layer 305 is also deposited on the hard mask layer 303. The photoresist layer 305 can be deposited in an area that corresponds to a surface area of the fin structure of the matched capacitors. In other words, the photoresist layer 305 can be in an area that corresponds to the source 103, drain 105, and channel comprising the fin structure 201 in the example depiction of FIG. 2.

Figure 4:
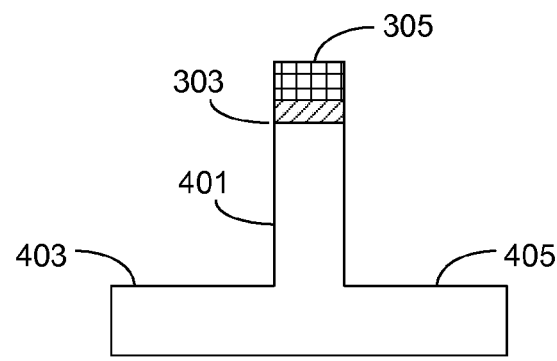

Reference is now made to FIG. 4, which illustrates formation of the semiconductor fin structure 401 which will in turn form a portion of the matched capacitors as will be shown in subsequent drawings. The fin structure 401 can be formed by etching a portion of the substrate 301 upon which the photoresist layer 305 is not deposited. The portion of the hard mask layer 303 and substrate 301 not can be etched by employing a suitable etching technique, such as any wet or dry etching techniques known in the art to selectively etch a portion of the semiconductor substrate 301 on which a photoresist layer 305 is not deposited. The etching of the semiconductor substrate 301 as shown in FIG. 4 to form the fin structure 401 can also act to form a trench 403, 405 adjacent to a first side and a second side of the fin structure. It should also be appreciated that a separate etching process can be employed to form trenches alongside the fin structure 401.

Figure 5:
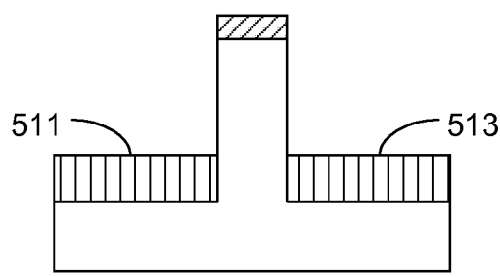

Accordingly, reference is now made to FIG. 5, which illustrates formation of an isolation layer 511, 513 in each respective trench 403, 405 adjacent to the fin structure. The photoresist layer 305 can be removed with a chemical etching technique or any other technique suitable to remove a photoresist layer 305. The isolation layer 511, 513 can then be deposited onto the semiconductor substrate and comprise an oxide or any insulating or dielectric material that can reduce and/or prevent leakage of current to or from the fin structure 401 and/or any other components of the matched capacitors shown in the subsequent drawings. Such a technique is known in the art as shallow trench isolation. In some embodiments, shallow trenches can be formed adjacent to the fin structure 401 and an isolation layer deposited therein, with excess material, or material deposited into the trenches that extends above the height of the trenches, can be subsequently etched away.

Figure 6:
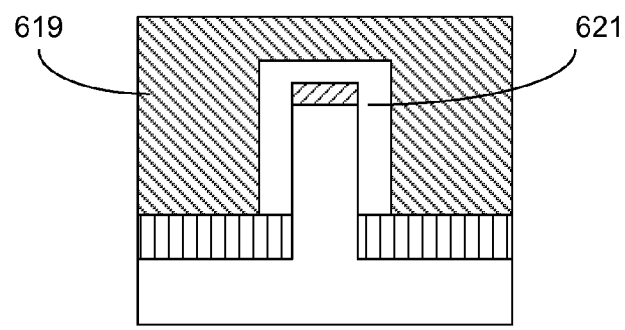

Reference is now made to FIG. 6, which illustrates depositing of an insulator layer 621 and a conductor layer 619 on the fin structure 401. An insulator layer 621 can be deposited onto the fin structure 401 such that it covers the exposed sides of the fin structure 401. In other words, the insulator layer 621 can be deposited such that it covers a top of the fin structure 201 as well as a first side surface and second side surface of the fin structure 201. The insulator layer 621 can comprise, for example, an oxide material, a high-K dielectric, $SiO_2$, or any other material that possesses insulating properties and that can be employed in FinFET devices.

A conductor layer 619 can also be deposited as shown. The conductive layer 619 can be any conductive material, such as, but not limited to, a conductive metal, poly-crystalline silicon, polysilicon, or any other conductive material that can act as a conductive material in a semiconductor device as can be appreciated. The conductor layer 619 can be deposited so that it is adjacent to the insulator layer 621 as well as atop the isolation layers 511, 513. A first gate and a second gate are formed from the conductive layer 619 as shown in the subsequent drawings.

Figure 7:
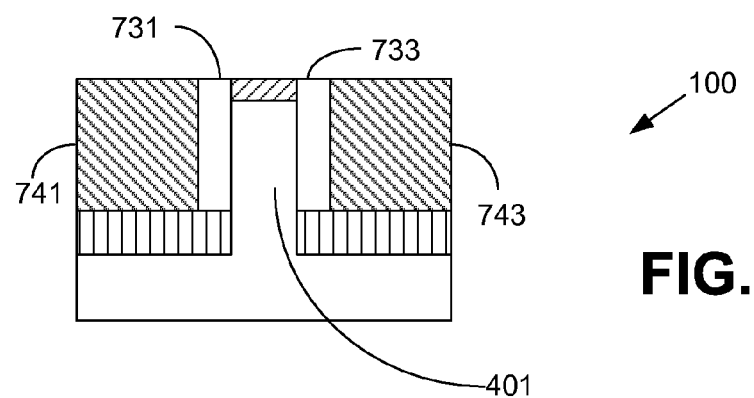

Reference is now made to FIG. 7, which illustrates a pair of matched capacitors 100 according to an embodiment of the disclosure. As illustrated in FIG. 7, the insulator layer 621 can be etched using known etching techniques compatible with a FinFET manufacturing process such that a resultant first insulator structure 731 and second insulator structure 733 are formed adjacent to a first side surface and second side surface of the fin structure, respectively. Additionally, the conductive layer 619 can also be etched using known etching techniques compatible with a FinFET manufacturing process as well as the conductive material chosen such that a first conductor structure 741 and a second conductor structure 743 are formed adjacent to the first insulator structure 731 and second insulator structure 733, respectively.

It should be noted that the insulator layer 621 as well as conductive layer 619 shown in FIG. 6 should, in one embodiment, be etched to a sufficient degree such that distinct structures are formed on opposing sides of the fin structure 401. Additionally, in the depicted embodiment, the hard mask layer 303 deposited atop the fin structure 401 has not been etched such that it is removed. In some embodiments, the hard mask layer 303 can remain atop the fin structure 401 to aid in the structural stability of the fin structure 401. In other embodiments, the hard mask layer 303 can be etched so that it is removed prior to deposition of the insulator layer 621. In such a scenario, the insulator layer 621 can also be etched to form a distinct first insulator structure 731 and second insulator structure 733 adjacent to the first side surface and second side surface of the fin structure 401. In the depicted device, a charge can be held across each of the conductor structures as well as the fin structure 401, resulting in a pair of matched capacitors that share a common semiconductor fin structure 401 and that are formed from a common deposition of a conductive material. As a result, the properties of the pair of capacitors are very similar and suitable for applications for which matched capacitors are desired.

Figure 8:
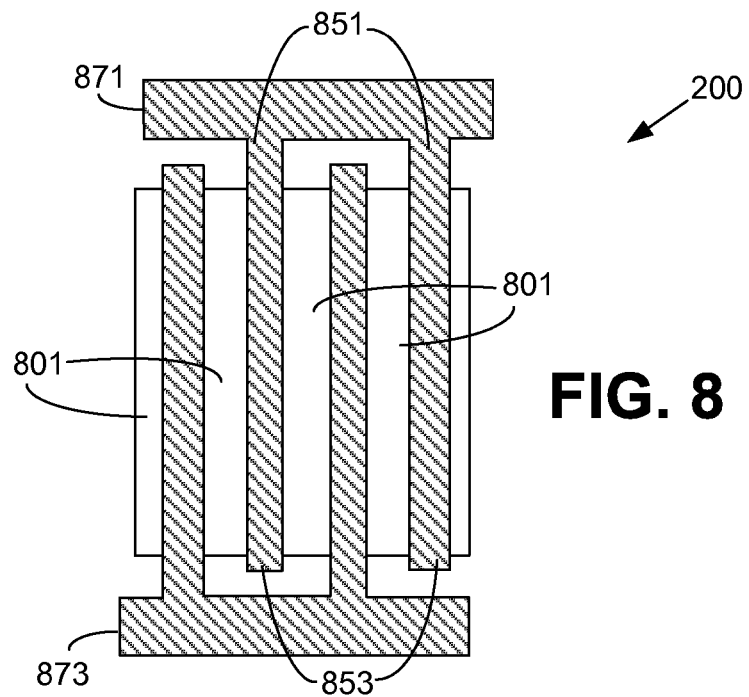
FIGS. 8-9 illustrate an alternative depiction of a pair of matched capacitors having an additional number of fin structures and/or gate structures according to an embodiment of the disclosure.

Reference is now made to FIG. 8, which illustrates an alternative embodiment of a pair of matched capacitors 200 according to the present disclosure. In the example shown in FIG. 8, an alternating array of conductor structures 851, 853 as well as fin structures 801 can be formed depending on the capacitance properties of a desired pair of matched capacitors. In the depicted structure, a first capacitor can be formed such that a plurality of conductor structures are formed adjacent to insulator structures that are in turn adjacent to a side surface of a plurality of respective semiconductor fin structures. Likewise, a second capacitor can be formed such that a plurality of distinct conductor structures are formed adjacent to insulator structures that are in turn adjacent to another side surface of the plurality of semiconductor fin structures. The conductor structures 851, 853 comprising the first capacitor as well as the second capacitor can be mechanically as well as conductively linked with a bridge structure 871, 873 as shown in FIG. 8. In this way, a designer can construct device having large capacitance by increasing the number of fin structures as well as gate conductor structures as needed.

Figure 9:
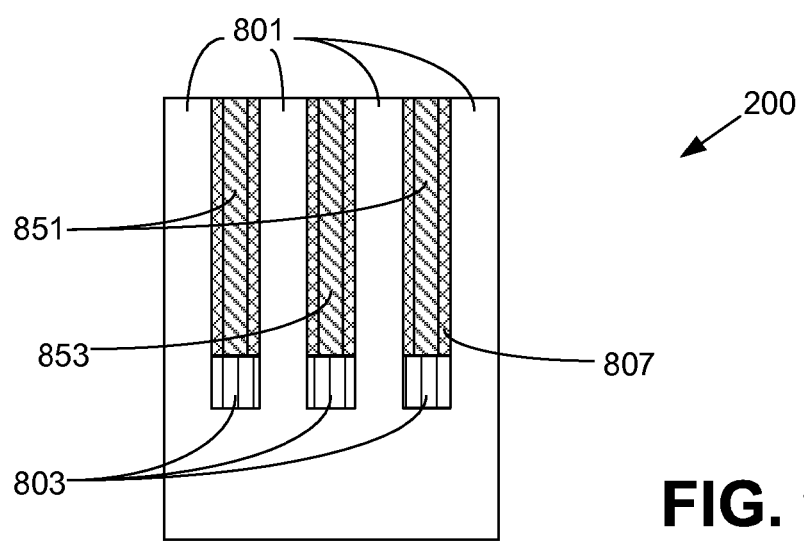

FIG. 9 illustrates a cross sectional view of a device such as is described with reference to FIG. 8. In the example of FIG. 9, a plurality of fin structures 801 are formed, as are isolation layers 803 adjacent to each of the fin structures. Insulator structures 807 are also formed adjacent to a respective first side surface and second side surface of each fin structures as described above. Conductor structures 851, 853 are also formed adjacent to the insulator structures 807. It should be noted that the conductor structures 851, 853 can be formed such that they are disposed between adjacent fin structures in the depicted alternating array. In this way, a charge can be held across a conductor structures and two adjacent fin structures.

Figure 10A:
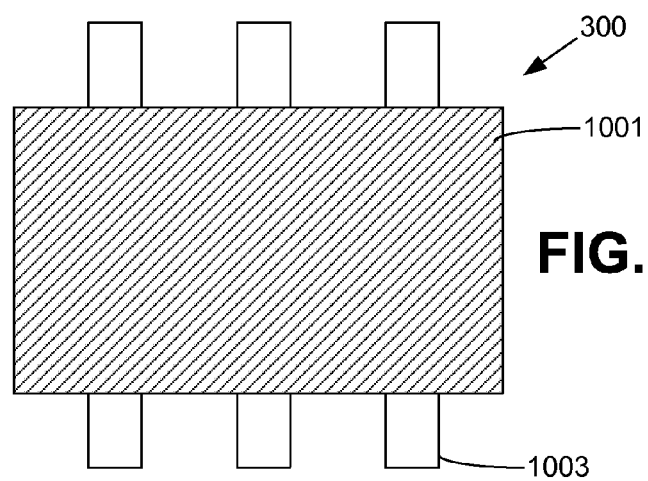
FIGS. 10A-10B illustrate a resistor according to an embodiment of the disclosure.
Figure 10B:
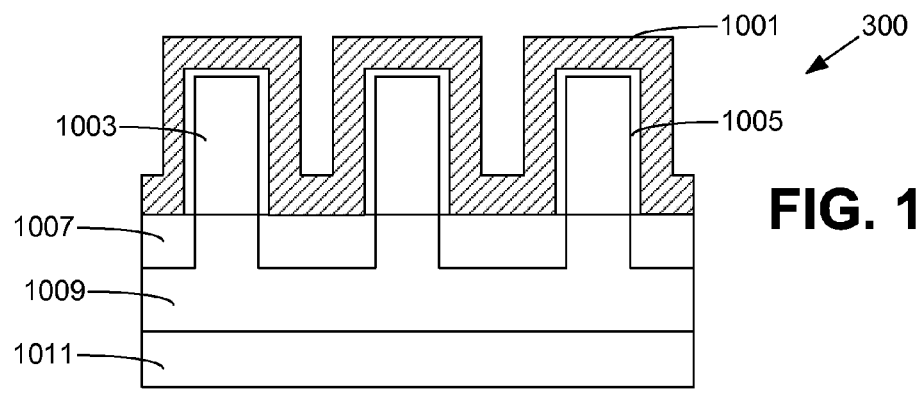

Reference is now made to FIGS. 10A-10B, which illustrates an embodiment of a resistor 300 manufactured with FinFET techniques according to an embodiment of the disclosure. Unsilicided poly resistors are widely employed in integrated circuit design. In some designs, large resistances are required, particularly in certain analog circuits. The resistance of a resistor in a semiconductor device can be calculated according to the following formula, where R is a measure of the resistance (e.g., Ohms), ρ is a measure of the resistivity of the material chosen to form the resistor, L is the length of the resistor, and A is its cross-sectional area:

$$R = \rho * L/A$$

It should be appreciated that in some embodiments, instead of the cross-sectional area being used to calculate resistance of a resistor, the width of the conductor chosen to form the resistor can also be used. Accordingly, to accomplish a large resistance according to certain prior art designs, a resistor having an absolute length that is proportional to its resistance value is generally required. Embodiments of the present disclosure are directed to a resistor design and method of manufacture that allows a resistor whereby the effective length can be increased without consuming corresponding additional space on a substrate.

Therefore, FIGS. 10A-10B illustrate one example of a resistor according to embodiments of the present disclosure. FIG. 10A illustrates a top plan view of a resistor 300 according to the disclosure. In the depicted example, a conductor layer 1001 is deposited atop one or more semiconductor fin structures 1003. As will be shown in subsequent drawings, an insulator is deposited between the fin structures 1003 and conductor layer 1001.

Accordingly, reference is made to FIG. 10B, which illustrates a cross-sectional view of the resistor 300 in FIG. 10A. As shown in FIG. 10B, a conductor layer 1001 is deposited atop an insulator layer 1005 that insulates the conductor from the semiconductor fin structures 1004. The non-limiting example resistor of FIG. 10B is further defined by isolation layers 1007 formed adjacent to the fin structures 1003. In other words, the manufacturing process can employ shallow trench isolation techniques to reduce and/or prevent leakage of current from, for example, the conductor layer 1001 to the substrate.

The substrate can comprise, for example, a p-type semiconductor substrate 1011 in which the depicted fin structures 1003 can be formed. The resistor is also characterized by an n-well 1009 formed in the p-type semiconductor substrate 1011 beneath some portion of the fin structure 1003. The n-well 1009 can be formed via diffusion, ion implantation, and/or any other techniques known in the art to form an n-well in a p-type substrate 1011. The n-well 1009 is formed in the p-type substrate 1011 to aid in isolation between the p-type substrate and the conductor layer 1001.

Accordingly, because FinFET manufacturing techniques are employed in the depicted resistor, the effective length of the conductor is longer than the linear distance traveled by the conductor layer 1001. In the depicted example, the effective length can be characterized by the following equation, where $L_{eff}$ is the effective length of the conductor, L is the linear distance traversed by the conductor, H is the height of the conductor, and N is the number of fin structures 1003 on which the conductor layer 1001 is formed:

$$L_{eff}=L+2*h*N$$

According to the above equation, the effective length of the conductor layer 1001 also includes the height of the fin structures 1003 upon which the conductor layer 1001 is deposited as well as the linear distance traversed by the conductor layer 1001 relative to the semiconductor substrate 1011.

Figure 11:
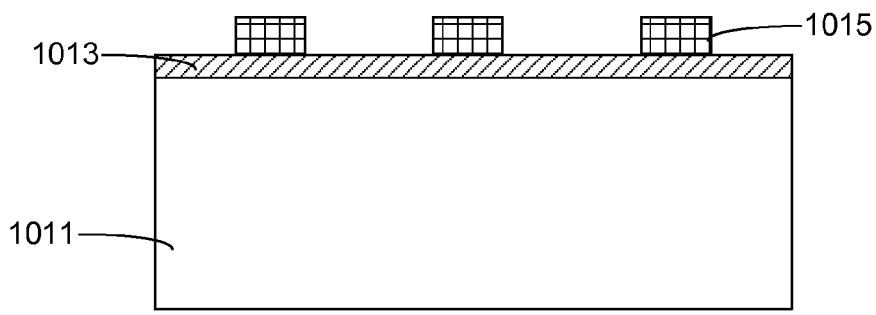
FIGS. 11-17 illustrate a method of manufacturing a resistor according to an embodiment of the disclosure.

Accordingly, reference is now made to FIGS. 11-17, which illustrate manufacture of a resistor according to an embodiment of the disclosure. As shown in FIG. 11, a hard mask layer 1013 can be deposited on a semiconductor substrate 1011. In one embodiment, the substrate 1011 can comprise a p-type semiconductor material. As noted above, the hard mask layer 1013 can comprise a nitride, oxide, and/or other materials known in the art possessing similar properties. Additionally, a photoresist layer 1015 can be deposited atop the hard mask layer 1013 in each position where a fin structure is desired.

Figure 12:
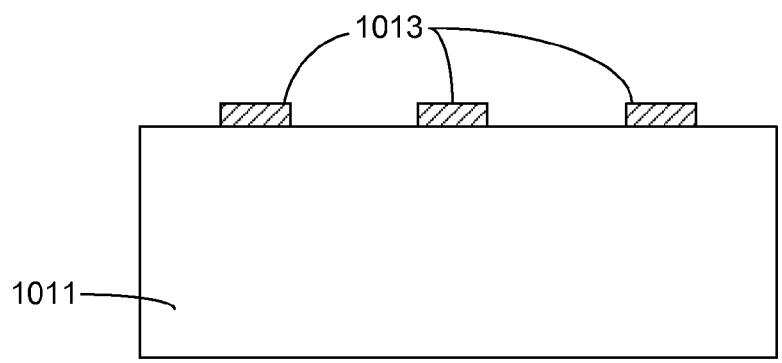
Figure 13:
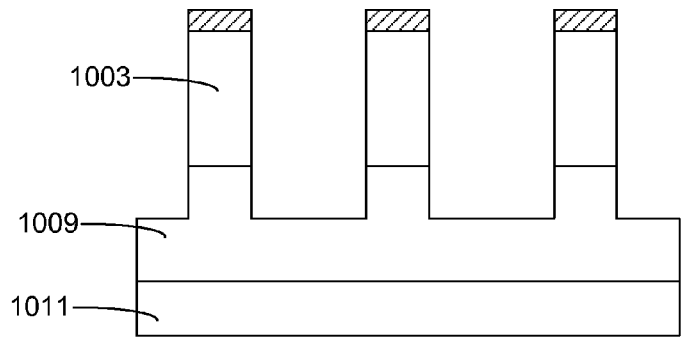

As shown in FIG. 12, the substrate 1011 and hard mask layer 1013 can be etched and the photoresist layers 1015 removed so that the fin regions can be defined. Any suitable etching techniques, such as semiconductor lithography and/or any other techniques can be employed to etch the hard mask layer 1013 where the photoresist layer 1015 is not placed. As noted above, the hard mask layer 1013 defines the fin regions as well as aids in the structural stability of the fin structures during and/or after formation of the structure. As shown in FIG. 13, the semiconductor substrate 1011 can be selectively etched to form the fin structures 1003. The etching illustrated in FIG. 13 can form trenches adjacent to each of the fin structures to facilitate shallow trench isolation. Additionally, the n-well 1009 can be formed underneath the fin structure 1003 by imparting appropriate dopants in a region of the substrate beneath the fin structures 1003. The n-well 1009 can be formed such that a portion of the p-type semiconductor substrate 1011 remains beneath the n-well 1009 as well as the fin structure 1003 remaining a p-type semiconductor material as formed from the substrate.

Figure 14:
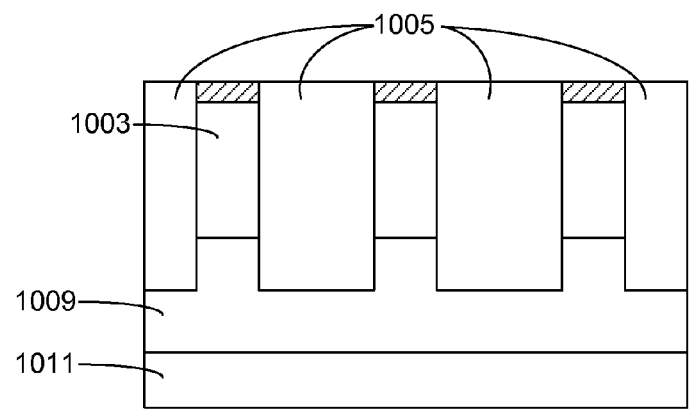
Figure 15:
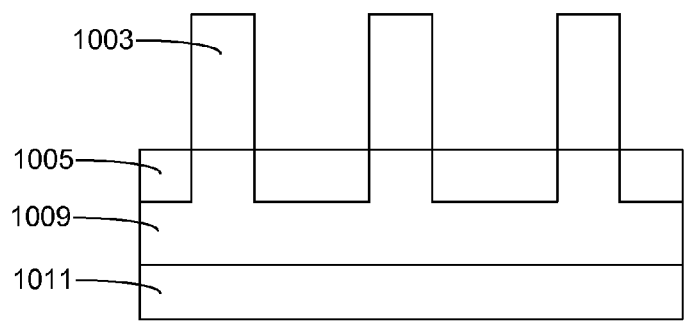

Reference is now made to FIG. 14, which illustrates deposition of isolation layers 1005 in the trenches adjacent to each of the fin structures 1003. As noted above, the isolation layers 1005 employed in such a shallow trench isolation procedure can comprise an oxide layer or any other material suitable for use with shallow trench isolation. Accordingly, in FIG. 15, the isolation layers 1005 can be etched such that the fin structures 1003 are exposed above the semiconductor substrate 1011 and n-well 1009.

Figure 16:
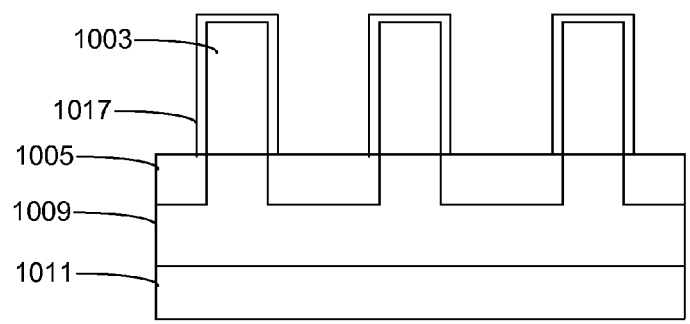
Figure 17:
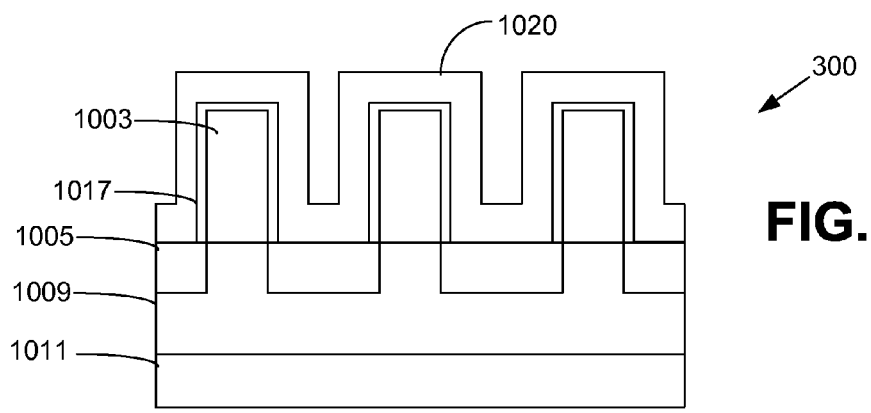

FIG. 16 illustrates deposition of an insulator layer 1017 that can insulate each of the fin structures 1003 from a conductor that comprises a resistor. The insulator layer 1017 deposited atop each of the fin structures 1003 can be formed by depositing an insulator material in bulk and subsequently etching the deposited insulator material to form the depicted insulator layers 1017 atop each of the fin structures 1003. The insulator layer 1017 can comprise, for example, an oxide material, a high-k dielectric material, or any other material suitable to act as an insulator in a semiconductor device. FIG. 17 illustrates forming of a conductor layer 1020 deposited atop the fin structures 1003. As noted above, a conductor layer 1020 can comprise a polysilicon, metal, or any other material suitable to employ as a conductor in a semiconductor device. The conductor layer 1020 traverses a first side surface, a top surface, and a second side surface of each of the fin structures 1003. As noted above, the number of fin structures 1003 can be chosen to yield an effective length of the resistor and in turn a desired resistance.

It should be appreciated by a person of ordinary skill in the art that embodiments of the disclosure are not limited to the examples depicted in the drawings and/or discussed in the above text. It should also be appreciated that the drawings are not necessarily to scale, nor are the lines designating the boundaries between the various layers of the illustrated devices meant to limit the embodiments of the disclosure. For example, the lines defining layers and structures shown in the drawings may not form straight lines and/or right angles, and that the drawings are merely provided to illustrate the concepts discussed herein. Additionally, it should also be appreciated that embodiments of the disclosure are not limited to the specific fabrication steps described herein.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method, comprising:
   forming a fin structure in a semiconductor substrate, the fin structure having a first side surface and a second side surface, the first side surface and the second side surface opposing each other relative to the fin structure;
   forming a first trench adjacent to the first side surface and a second trench adjacent to the second side surface in the semiconductor substrate;
   forming an isolation layer within the first trench and the second trench;
   forming an insulator layer adjacent to the first side surface and the second side surface;
   forming a conductor layer adjacent to the insulator layer;
   etching the conductor layer to form two separate and distinct conductor structures, wherein:
      one of the two separate and distinct conductor structures is adjacent to the isolation layer within the first trench, and another of the two separate and distinct conductor structures is adjacent to the isolation layer within the second trench; and
      the two separate and distinct conductor structures share the fin structure;
   forming a first bridge structure that is connected to the one of the two separate and distinct conductor structures and that extends orthogonally with respect to the one of the two separate and distinct conductor structures; and
   forming a second bridge structure that is connected to the another of the two separate and distinct conductor structures and that extends orthogonally with respect to the another of the two separate and distinct conductor structures, wherein the first bridge structure is distinct and separate from the second bridge structure.

2. The method of claim 1, further comprising:
   forming a second fin structure in the semiconductor substrate, the second fin structure having a third side surface and a fourth side surface, the third side surface and the fourth side surface opposing each other relative to the second fin structure, the second fin structure further being adjacent to the first trench; and
   forming another insulator layer adjacent to the third side surface.

3. The method of claim 2, further comprising:
   forming the conductor layer adjacent to the second fin structure.

4. The method of claim 1, further comprising:
   depositing a hard mask layer in the semiconductor substrate;
   depositing a photoresist on the hard mask layer in a position corresponding to a location of the fin structure, the photoresist sized to have a surface area of a cross-sectional area of the fin structure; and
   etching the hard mask layer to form the fin structure.

5. The method of claim 4, further comprising:
   depositing an insulator material subsequent to etching the hard mask layer to form the fin structure, the insulator material being in contact with the fin structure.

6. The method of claim 1, wherein the conductor layer comprises one of: a metal or a doped polysilicon.

7. The method of claim 1, wherein the semiconductor substrate comprises silicon.

8. The method of claim 1, wherein the insulator layer comprises one of: a high-k dielectric material or an oxide insulator material.

9. The method of claim 1, further comprising:
   forming an n-well in the semiconductor substrate.

10. The method of claim 9, wherein the n-well is positioned within the semiconductor substrate beneath the fin structure.

11. The method of claim 1, wherein the first bridge structure and the second bridge structure have interlocking comb-shaped arrays of conductor structures with respect to each other.

12. A semiconductor device, comprising:
    a fin structure in a semiconductor substrate, the fin structure having a first side surface and a second side surface, the first side surface and the second side surface opposing each other relative to the fin structure;
    a first trench adjacent to the first side surface and a second trench adjacent to the second side surface in the semiconductor substrate;
    a first isolation structure within the first trench and a second isolation structure within the second trench;
    a first insulator structure adjacent to the first side surface and a second insulator structure adjacent to the second side surface;
    a first conductor structure adjacent to the first isolation structure that is within the first trench and a second conductor structure adjacent to the second isolation structure that is within the second trench, wherein the first conductor structure and the second conductor structure share the fin structure;
    a first bridge structure that is connected to the first conductor structure and that extends orthogonally with respect to the first conductor structure; and
    a second bridge structure that is connected to the second conductor structure and that extends orthogonally with respect to the second conductor structure, wherein the first bridge structure is distinct and separate from the second bridge structure.

13. The semiconductor device of claim 12, wherein
    the first conductor structure comprises at least one of: a metal or a doped polysilicon;
    the second conductor structure comprises at least one of: the metal or the doped polysilicon;
    the first insulator structure comprises at least one of: a high-k dielectric material or an oxide insulator material; and
    the second insulator structure comprises at least one of: the high-k dielectric material or the oxide insulator material.

14. The semiconductor device of claim 12, wherein the first conductor structure is directly adjacent to the first insulator structure.

15. The semiconductor device of claim 14, wherein the second conductor structure is directly adjacent to the second insulator structure.

16. The semiconductor device of claim 12, wherein the first conductor structure is in contact with the first insulator structure.

17. The semiconductor device of claim 16, wherein the second conductor structure is in contact with the second insulator structure.

18. The semiconductor device of claim 12, wherein the first conductor structure has a same size as the second conductor structure.

19. The semiconductor device of claim 12, wherein the first isolation structure is in contact with the first side surface of the fin structure and the semiconductor substrate.

20. The semiconductor device of claim 12, wherein the first bridge structure and the second bridge structure have interlocking comb-shaped arrays of conductor structures with respect to each other.

* * * * *

UNITED STATES PATENT AND TRADEMARK OFFICE
CERTIFICATE OF CORRECTION

PATENT NO. : 9,293,584 B2
APPLICATION NO. : 13/287331
DATED : March 22, 2016
INVENTOR(S) : Xiangdong Chen et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 274 days.

Signed and Sealed this
Twenty-sixth Day of July, 2016

Michelle K. Lee
*Director of the United States Patent and Trademark Office*